US012558990B2

(12) United States Patent
Nam et al.

(10) Patent No.: US 12,558,990 B2
(45) Date of Patent: Feb. 24, 2026

(54) BATTERY MANAGEMENT SYSTEM, BATTERY MANAGEMENT METHOD, BATTERY PACK, AND ELECTRIC VEHICLE

(71) Applicant: LG Energy Solution, Ltd., Seoul (KR)

(72) Inventors: Gi-Min Nam, Daejeon (KR); Hyeong-Seok Kim, Daejeon (KR); Won-Tae Joe, Daejeon (KR); Tae-Hyun Hwang, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 629 days.

(21) Appl. No.: 18/005,787

(22) PCT Filed: Aug. 18, 2021

(86) PCT No.: PCT/KR2021/010980
§ 371 (c)(1),
(2) Date: Jan. 17, 2023

(87) PCT Pub. No.: WO2022/039505
PCT Pub. Date: Feb. 24, 2022

(65) Prior Publication Data
US 2023/0278459 A1 Sep. 7, 2023

(30) Foreign Application Priority Data

Aug. 20, 2020 (KR) ........................ 10-2020-0104883

(51) Int. Cl.
B60L 58/12 (2019.01)
B60L 53/66 (2019.01)
(Continued)

(52) U.S. Cl.
CPC ............... B60L 58/12 (2019.02); B60L 53/66 (2019.02); G01R 31/387 (2019.01);
(Continued)

(58) Field of Classification Search
CPC .............. G01R 31/387; G01R 31/3842; G01R 31/367; B60L 58/12; B60L 53/66;
(Continued)

(56) References Cited

U.S. PATENT DOCUMENTS 6,087,810 A 7/2000 Yoshida
11,539,229 B2 * 12/2022 Zhang ................... H02J 7/0047
(Continued)

FOREIGN PATENT DOCUMENTS

CN 102474124 A 5/2012
CN 103935260 A 7/2014
(Continued)

OTHER PUBLICATIONS

Rai, R. et al., " Multi-Level Constant Current Based Fast Li-Ion Battery Charging Scheme With LMS Based Online State of Charge Estimation", Dept. of Electrical & Electronics Engg, National Institute of Technology Goa, India, Jul. 2020, Kansas Power and Energy Conference (KPEC), IEEE, pp. 1-6,.
(Continued)

*Primary Examiner* — Laura K Tso
(74) *Attorney, Agent, or Firm* — Lerner David LLP

(57) ABSTRACT

A battery management system includes a sensing unit to generate a sensing signal indicating a battery voltage and a battery current of a battery, a memory unit to store a charge map recording first to $n^{th}$ reference currents, first to $n^{th}$ reference voltage ranges, first to $n^{th}$ reference states of charge (SOCs) and first to $n^{th}$ reference voltage curves for multi-stage constant-current charging, and a control unit to command constant-current charging to a charging circuit using a $k^{th}$ reference current corresponding to a $k^{th}$ reference voltage range to which the battery voltage belongs, and update the charge map by comparing a $k^{th}$ measured voltage curve indicating a correlation between the battery voltage
(Continued)

and the SOC of the battery over a charging period of the constant-current charging with a $k^{th}$ reference voltage curve in response to the battery voltage having reached an upper limit of the $k^{th}$ reference voltage range.

11 Claims, 5 Drawing Sheets

(51) Int. Cl.

| | | |
|---|---|---|
| *G01R 31/387* | (2019.01) | |
| *H01M 10/44* | (2006.01) | |
| *H01M 10/46* | (2006.01) | |

(52) U.S. Cl.
CPC ........... *H01M 10/44* (2013.01); *H01M 10/46* (2013.01); *B60L 2240/545* (2013.01); *B60L 2240/547* (2013.01); *B60L 2240/549* (2013.01)

(58) Field of Classification Search
CPC ......... B60L 2240/545; B60L 2240/547; B60L 2240/549; B60L 53/00; H02J 7/00712; H02J 7/0047; H01M 10/425; H01M 10/44; H01M 10/46; H01M 10/48
USPC ......................................... 320/132, 149, 162
See application file for complete search history.

(56) References Cited

U.S. PATENT DOCUMENTS

| | | | | |
|---|---|---|---|---|
| 2008/0048616 | A1* | 2/2008 | Paul ................... | G01R 31/3648 320/132 |
| 2011/0037438 | A1 | 2/2011 | Bhardwaj et al. | |
| 2011/0285357 | A1 | 11/2011 | Kikuchi et al. | |
| 2012/0086406 | A1 | 4/2012 | Maeagawa | |
| 2012/0169284 | A1* | 7/2012 | Park ......................... | H02J 7/04 320/112 |
| 2013/0335034 | A1 | 12/2013 | Suzuki et al. | |
| 2015/0340885 | A1 | 11/2015 | Baek et al. | |
| 2017/0271887 | A1 | 9/2017 | Heo | |
| 2018/0123354 | A1 | 5/2018 | Lim et al. | |
| 2019/0363546 | A1* | 11/2019 | Abe ...................... | H02J 7/0047 |
| 2020/0366115 | A1 | 11/2020 | Kim et al. | |
| 2021/0190878 | A1 | 6/2021 | Lee et al. | |
| 2022/0006313 | A1* | 1/2022 | Lim ................... | H01M 10/486 |
| 2023/0280408 | A1* | 9/2023 | Nam ...................... | H01M 10/44 320/162 |

FOREIGN PATENT DOCUMENTS

| | | |
|---|---|---|
| EP | 3916884 A1 | 12/2021 |
| JP | H07115733 A | 5/1995 |
| JP | H09121462 A | 5/1997 |
| JP | 2008220121 A | 9/2008 |
| JP | 4689768 B2 | 5/2011 |
| JP | 4805863 B2 | 11/2011 |
| JP | 2015186316 A | 10/2015 |
| JP | 6106800 B2 | 4/2017 |
| JP | 6145712 B2 | 6/2017 |
| JP | 2020046332 A | 3/2020 |
| JP | 2020119658 A | 8/2020 |
| KR | 101201110 B1 | 11/2012 |
| KR | 101680324 B1 | 11/2016 |
| KR | 20170022778 A | 3/2017 |
| KR | 20170062133 A | 6/2017 |
| KR | 20180048281 A | 5/2018 |
| KR | 20200026128 A | 3/2020 |
| KR | 20200030467 A | 3/2020 |
| WO | 2010137334 A1 | 12/2010 |
| WO | 2011061902 A1 | 5/2011 |
| WO | 2012127775 A1 | 9/2012 |

OTHER PUBLICATIONS

Extended European Search Report including Written Opinion for Application No. 21858592.5 dated Nov. 7, 2023, pp. 1-7.
International Search Report for Application No. PCT/KR2021/010980 mailed Nov. 24, 2021, pp. 1-3.

* cited by examiner

Figure 4:
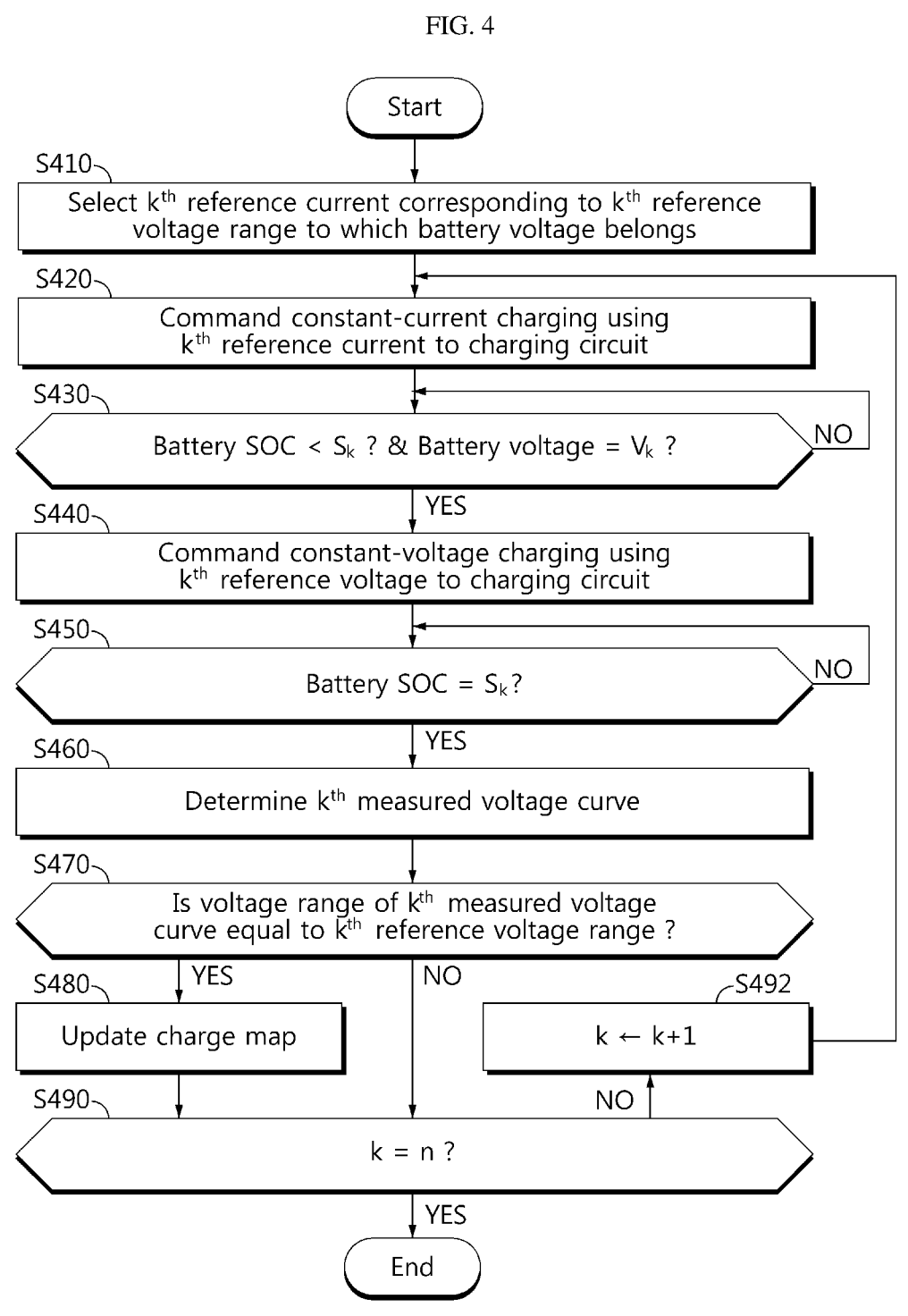

Start

S410
Select $k^{th}$ reference current corresponding to $k^{th}$ reference voltage range to which battery voltage belongs S420
Command constant-current charging using $k^{th}$ reference current to charging circuit S430
Battery SOC < $S_k$ ? & Battery voltage = $V_k$ ?     NO

YES

S440
Command constant-voltage charging using $k^{th}$ reference voltage to charging circuit S450
Battery SOC = $S_k$?     NO

YES

S460
Determine $k^{th}$ measured voltage curve

S470
Is voltage range of $k^{th}$ measured voltage curve equal to $k^{th}$ reference voltage range ?

YES          NO

S480
Update charge map

S492
k ← k+1

S490
NO          NO k = n ?

YES

End

BATTERY MANAGEMENT SYSTEM, BATTERY MANAGEMENT METHOD, BATTERY PACK, AND ELECTRIC VEHICLE

CROSS-REFERENCE TO RELATED APPLICATIONS

The present application is a national phase entry under 35 U.S.C. § 371 of International Application No. PCT/KR2021/010980 filed Aug. 18, 2021, which claims priority from Korean Patent Application No. 10-2020-0104883 filed Aug. 20, 2020, all of which are incorporated herein by reference.

TECHNICAL FIELD

The present disclosure relates to battery charge control.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

In the constant-current charging of a battery, when the current rate of the charge current is low, it takes a very long time to fully charge the battery. In contrast, when the current rate of the charge current is too high, the battery degrades fast.

One of charge protocols proposed to solve this problem is 'multi-stage constant-current charging', namely, stepwise adjustment of the current rate of the charge current according to the State Of Charge (SOC) or voltage of the battery during charging. The current rate is a value obtained by dividing the charge current by the maximum capacity of the battery, and may be referred to as 'C-rate', and it's unit is 'C'. A multi-stage constant-current charge map includes at least one data array recording a correlation between a plurality of voltage ranges and a plurality of C-rates. A charging procedure using the multi-stage constant-current charge map includes repeating the process of supplying the charge current of the next C-rate to the battery each time the voltage of the battery reaches the upper limit value of each voltage range.

As the battery degrades from Beginning Of Life (BOL), degradation by the same C-rate may be accelerated. For example, when constant-current charging is performed using the same C-rate over a specific voltage range, as the battery degrades, more lithium deposition occurs.

However, the charging procedure using the multi-stage constant-current charge map according to the related art does not consider the operational state (for example, degradation) of the battery that changes over time.

SUMMARY

Technical Problem

The present disclosure is designed to solve the above-described problem, and therefore the present disclosure is directed to providing a battery management system, a battery management method, a battery pack and an electric vehicle, in which a multi-stage constant-current charge map is updated according to the operational state of a battery based on the voltage and current of the battery monitored during charging using the multi-stage constant-current charge map.

The present disclosure is further directed to providing a battery management system, a battery management method, a battery pack and an electric vehicle, in which even though the charging procedure is not completed across all of a plurality of voltage ranges, the C-rate associated with the remaining voltage range having not undergone constant-current charging is updated based on the update result of the C-rate associated with at least one voltage range having undergone constant-current charging.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

A battery management system according to an aspect of the present disclosure includes a voltage sensor configured to generate a voltage signal indicating a battery voltage of a battery, a current sensor configured to generate a current signal indicating a battery current of the battery, memory configured to store a charge map recording a correlation between first to $n^{th}$ reference currents, first to $n^{th}$ reference voltage ranges, first to $n^{th}$ reference states of charge (SOCs) and first to $n^{th}$ reference voltage curves for multi-stage constant-current charging of the battery, and a controller, the memory having instructions programmed thereon that, when executed, are configured to cause the controller to determine a SOC of the battery based on at least one of the voltage signal or the current signal, in response to a charge start command, command constant-current charging to a charging circuit connected to the battery using a $k^{th}$ reference current corresponding to a $k^{th}$ reference voltage range to which the battery voltage belongs, and in response to the battery voltage having reached an upper limit of the $k^{th}$ reference voltage range, update the charge map by comparing a $k^{th}$ measured voltage curve indicating a correlation between the battery voltage and the SOC of the battery over a charging period of the constant-current charging with a $k^{th}$ reference voltage curve of the charge map. n is a natural number equal to 2 or greater, and k is a natural number of n or smaller.

The instructions may be configured to cause the controller to update the $k^{th}$ reference current based on a ratio of an average SOC of the $k^{th}$ measured voltage curve to an average SOC of the $k^{th}$ reference voltage curve.

The instructions may be configured to cause the controller to update the $k^{th}$ reference current based on a ratio of an average voltage of the $k^{th}$ reference voltage curve to an average voltage of the $k^{th}$ measured voltage curve.

The instructions may be configured to cause the controller to update the $k^{th}$ reference current based on a first ratio of an average SOC of the $k^{th}$ measured voltage curve to an average SOC of the $k^{th}$ reference voltage curve and a second ratio of an average voltage of the $k^{th}$ reference voltage curve to an average voltage of the $k^{th}$ measured voltage curve.

The instructions may be configured to cause the controller to update the $k^{th}$ reference current based on a ratio of a SOC of interest to a $k^{th}$ reference SOC. The SOC of interest is the SOC of the battery at a point in time when the battery voltage reaches the upper limit of the $k^{th}$ reference voltage range.

The instructions may be configured to cause the controller to update each remaining reference current except the $k^{th}$ reference current based on a ratio of the updated $k^{th}$ reference current to the $k^{th}$ reference current.

The instructions may be configured to cause the controller to command constant-voltage charging to the charging circuit using the upper limit of the $k^{th}$ reference voltage range in response to the battery voltage having reached the upper limit of the $k^{th}$ reference voltage range.

A battery pack according to another aspect of the present disclosure includes the battery management system of any of the embodiments described herein.

An electric vehicle according to still another aspect of the present disclosure includes the battery pack.

A battery management method according to yet another aspect of the present disclosure includes in response to a charge start command, commanding, by the controller, constant-current charging using a $k^{th}$ reference current corresponding to a $k^{th}$ reference voltage range to which a battery voltage of a battery belongs to a charging circuit connected to the battery, using a charge map recording a correlation between first to $n^{th}$ reference currents, first to $n^{th}$ reference voltage ranges, first to $n^{th}$ reference states of charge (SOCs) and first to $n^{th}$ reference voltage curves for multi-stage constant-current charging of the battery, and in response to the battery voltage having reached an upper limit of the $k^{th}$ reference voltage range, updating, by the controller, the charge map by comparing a $k^{th}$ measured voltage curve indicating a correlation between the battery voltage and a SOC of the battery over a charging period of the constant-current charging with a $k^{th}$ reference voltage curve of the charge map. n is a natural number equal to 2 or greater, and k is a natural number of n or smaller.

Updating the charge map may include updating the $k^{th}$ reference current based on a ratio of an average SOC of the $k^{th}$ measured voltage curve to an average SOC of the $k^{th}$ reference voltage curve.

Advantageous Effects

According to at least one of the embodiments of the present disclosure, it is possible to update a multi-stage constant-current charge map according to the operational state of a battery based on the voltage and current of the battery monitored during charging using the multi-stage constant-current charge map.

Additionally, according to at least one of the embodiments of the present disclosure, even though the charging procedure is not completed across all of a plurality of voltage ranges, the C-rate associated with the remaining voltage range having not undergone constant-current charging may be updated based on the update result of the C-rate associated with at least one voltage range having undergone constant-current charging.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 2 is a diagram exemplarily showing a correlation between a reference current and a reference voltage range recorded in a charge map.

FIG. 4 is a flowchart exemplarily showing a battery management method according to a first embodiment of the present disclosure.

DETAILED DESCRIPTION

Figure 1:
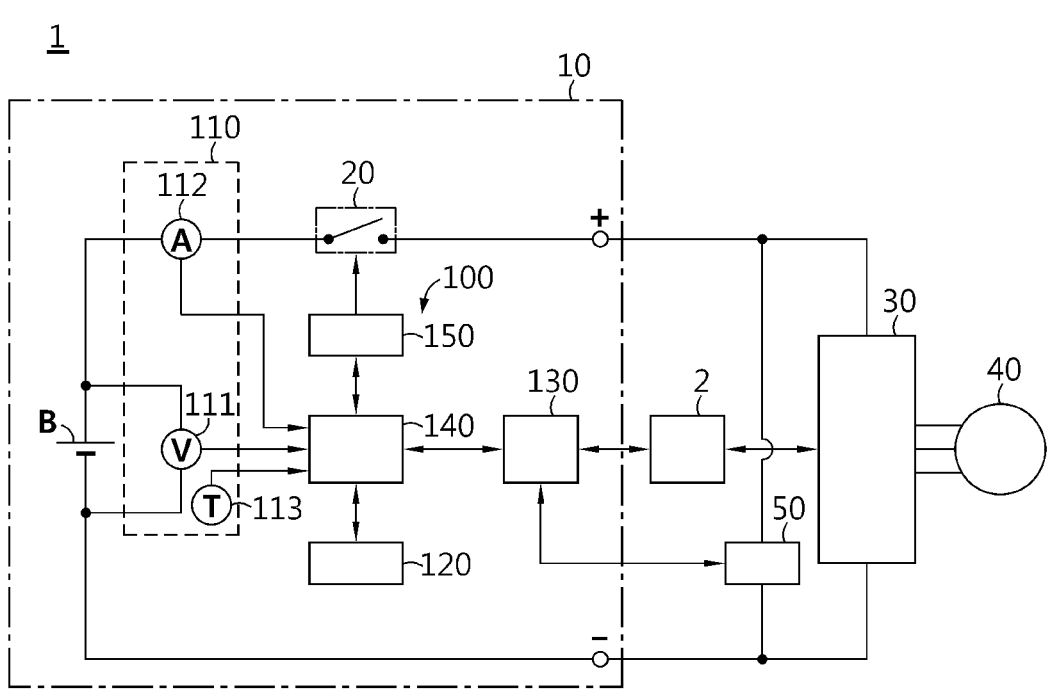
FIG. 1 is a diagram exemplarily showing a configuration of an electric vehicle according to the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and the illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as "first", "second" and the like, are used to distinguish one element from another among various elements, but not intended to limit the elements by the terms.

Unless the context clearly indicates otherwise, it will be understood that the term "comprises" when used in this specification, specifies the presence of stated elements, but does not preclude the presence or addition of one or more other elements. Additionally, the term "control unit" refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram exemplarily showing a configuration of an electric vehicle 1 according to the present disclosure.

Referring to FIG. 1, the electric vehicle 1 includes a battery pack 10, an inverter 30, an electric motor 40 and a charging circuit 50.

The battery pack 10 includes a battery B, a switch 20 and a battery management system 100.

The battery B includes at least one battery cell. Each battery cell is not limited to a particular type, and may include any battery cell that can be repeatedly recharged such as, for example, a lithium ion cell. The battery B may be coupled to the inverter 30 and/or the charging circuit 50 through a pair of power terminals provided in the battery pack 10.

The switch 20 is connected in series to the battery B. The switch 20 is installed on a current path for the charge/ discharge of the battery B. The on/off of the switch 20 is controlled in response to a switching signal from the battery management system 100. The switch 20 may be a mechanical relay that is turned on/off by the electromagnetic force of a coil or a semiconductor switch such as a Metal Oxide Semiconductor Field Effect transistor (MOSFET).

The inverter 30 is provided to convert the direct current (DC) from the battery B to alternating current (AC) in response to a command from the battery management system 100. The electric motor 40 may be, for example, a three-phase AC motor. The electric motor 40 works using the AC power from the inverter 30.

The battery management system 100 may be responsible for the general control related to the charge/discharge of the battery B.

The battery management system 100 includes a sensing unit 110, a memory unit 120 and a control unit 140. The battery management system 100 may further include at least one of an interface unit 130 or a switch driver 150.

The sensing unit 110 includes a voltage sensor 111 and a current sensor 112. The sensing unit 110 may further include a temperature sensor 113.

The voltage sensor 111 is connected in parallel to the battery B and configured to detect a battery voltage across the battery B and generate a voltage signal indicating the detected battery voltage. The current sensor 112 is connected in series to the battery B through the current path. The current sensor 112 is configured to detect a battery current flowing through the battery B and generate a current signal indicating the detected battery current. The temperature sensor 113 is configured to detect a temperature of the battery B and generate a temperature signal indicating the detected temperature.

The memory unit 120 may include at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory unit 120 may store data and programs required for the computation operation by the control unit 140. The memory unit 120 may store data indicating the result of the computation operation by the control unit 140.

The memory unit 120 stores a charge map. The charge map may be pre-stored in the memory unit 120 before the battery management system 100 is loaded, or may be received from, for example, a battery manufacturer, or a high-level controller 2 through the interface unit 130. The data recorded in the charge map may be preset based on test and/or simulation results of a sample battery having the same specification as the battery B.

The charge map is used in a charging procedure for multi-stage constant-current charging of the battery B. The charge map records a correlation between (i) first to $n^{th}$ reference currents, (ii) first to $n^{th}$ reference voltage ranges, (iii) first to $n^{th}$ reference state of charges (SOCs) and (iv) first to $n^{th}$ reference voltage curves for multi-stage constant-current charging. n is a natural number of 2 or greater. The later reference current may be smaller than the earlier reference current. Each reference voltage range may be referred to as 'stage'.

The interface unit 130 may include a communication circuit configured to support wired or wireless communication between the control unit 140 and the high-level controller 2 (for example, an Electronic Control Unit (ECU)). The wired communication may be, for example, controller area network (CAN) communication, and the wireless communication may be, for example, Zigbee or Bluetooth communication. The communication protocol is not limited to a particular type, and may include any communication protocol that supports the wired/wireless communication between the control unit 140 and the high-level controller 2. The interface unit 130 may include an output device (for example, a display, a speaker) to provide the information received from the control unit 140 and/or the high-level controller 2 in a recognizable format. The high-level controller 2 may control the inverter 30 based on battery information (for example, voltage, current, temperature, SOC) collected through the communication with the battery management system 100. The high-level controller 2 may transmit a charge start command or charge stop command to the battery management system 100 in response to the vehicle's user input.

The control unit 140 may be operably coupled to the high-level controller 2, the switch 20, the charging circuit 50, the sensing unit 110, the memory unit 120, the interface unit 130 and/or the switch driver 150. Operably coupled refers to directly/indirectly connected to transmit and receive a signal in one or two directions.

The switch driver 150 is electrically coupled to the control unit 140 and the switch SW. The switch driver 150 is configured to selectively turn on/off the switch SW in response to a command from the control unit 140. The control unit 140 may command the switch driver 150 to turn on the switch SW during the charging procedure.

The control unit 140 may collect a sensing signal from the sensing unit 110. The sensing signal indicates the detected voltage signal, the detected current signal and/or the detected temperature signal in synchronization.

The control unit 140 may be referred to as a 'battery controller', and may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing the other functions.

The interface unit 130 may relay the bi-directional communication between the control unit 140 and the charging circuit 50 and the bi-directional communication between the control unit 140 and the high-level controller 2. The charging circuit 50 is configured to supply a charge current of a C-rate requested from the battery management system 100 to the battery B. The charging circuit 50 may be configured to supply a charge voltage having a voltage level requested from the battery management system 100 to the battery B. The control unit 140 is configured to start the charging procedure using the charge map in response to receiving the charge start command through the interface unit 130. The control unit 140 may terminate the charging procedure using the charge map in response to receiving the charge stop command through the interface unit 130.

The control unit 140 may determine a SOC indicating the remaining capacity of the battery B based on the sensing signal. In determining the SOC, a well-known algorithm such as ampere counting, an open circuit voltage (OCV)-

SOC curve and a Kalman filter may be used. The SOC of the battery B may be referred to as a 'battery SOC'.

Figure 2:
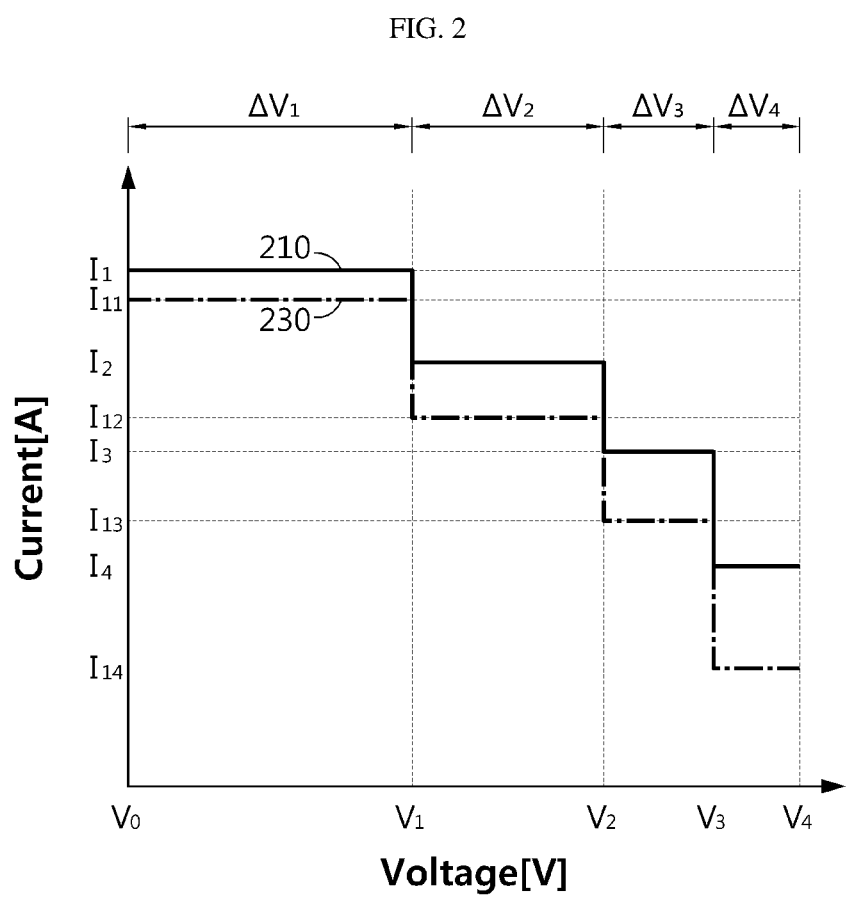
Figure 3:
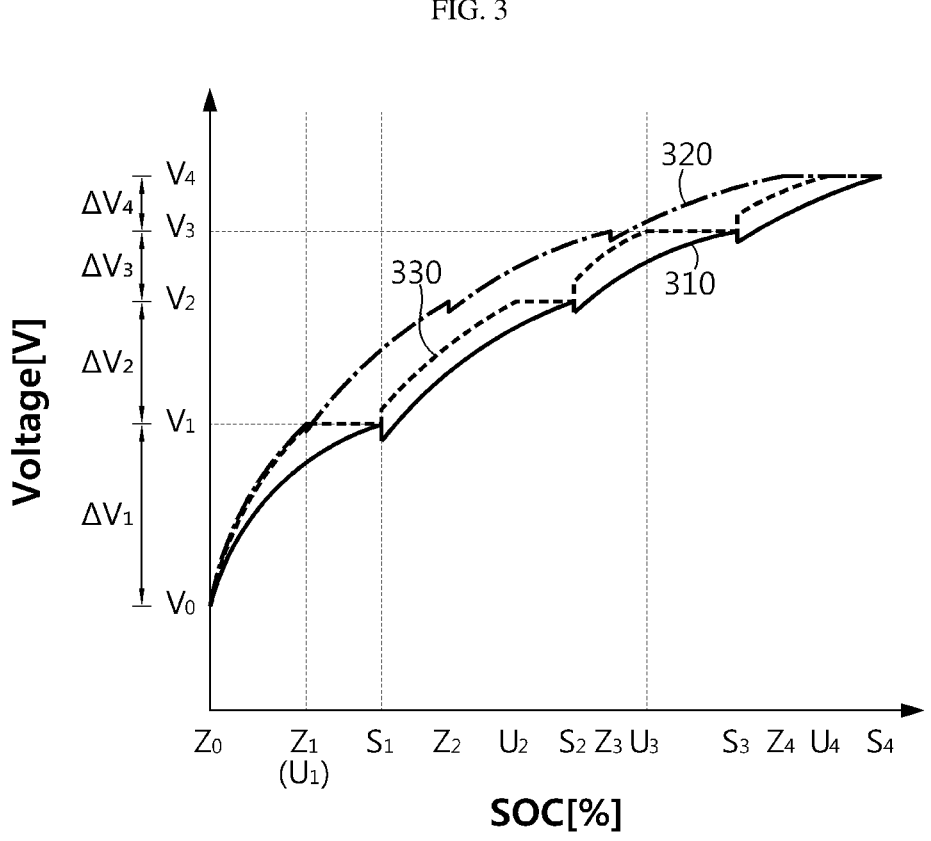
FIG. 3 is a diagram exemplarily showing a correlation between a reference voltage range and a reference state of charge (SOC) recorded in a charge map.

FIG. 2 is a diagram exemplarily showing the correlation between the reference current and the reference voltage range recorded in the charge map, and FIG. 3 is a diagram exemplarily showing the correlation between the reference voltage range and the reference SOC recorded in the charge map. For convenience of description, FIGS. 2 and 3 show n=4, that is, the charge map defining the correlation between four reference currents, four reference voltage ranges and four reference SOCs.

A current profile 210 shown in FIG. 2 indicates the correlation between the first to fourth reference currents $I_1$~$I_4$ and the first to fourth reference voltage ranges $\Delta V_1$~$\Delta V_4$ for the battery B at Beginning Of Life (BOL). The current profile 210 may be recorded in the charge map in the format of a data table. When k (may be referred to as a 'charge index') is a natural number of n or smaller, $V_{k-1}$ and $V_k$ is the lower limit and upper limit of the $k^{th}$ reference voltage range $V_k$, respectively.

The first to fourth reference voltage ranges $\Delta V_1$~$\Delta V_4$ are consecutive in a sequential order. Accordingly, when i is a natural number of (n−1) or smaller, $V_i$ is the upper limit of the $i^{th}$ reference voltage range $\Delta V_i$, and the lower limit of the $(i+1)^{th}$ reference voltage range $\Delta V_{i+1}$. For example, each of the upper limit of $\Delta V_2$ and the lower limit of $\Delta V_3$ is $V_2$ and equal to each other. Hereinafter, $V_k$ may be referred to as a '$k^{th}$ reference voltage'.

When the battery voltage of the battery B is found in the $i^{th}$ reference voltage range $\Delta V_i$, the control unit 140 may command constant-current charging using the $i^{th}$ reference current $I_i$ to the charging circuit 50.

During the constant-current charging using the $i^{th}$ reference current $I_i$, when the SOC of the battery B reaches the upper limit $V_i$ of the $i^{th}$ reference voltage range $\Delta V_i$, the control unit 140 may command constant-current charging using the $(i+1)^{th}$ reference current $I_{i+1}$ to the charging circuit 50. That is, the control unit 140 may change from the constant-current charging using the $i^{th}$ reference current $I_i$ to the constant-current charging using the $(i+1)^{th}$ reference current $I_{i+1}$.

During the constant-current charging using the $n^{th}$ reference current $I_n$, when the SOC of the battery B reaches the upper limit $V_n$ of the $n^{th}$ reference voltage range $\Delta V_n$, the control unit 140 may terminate the multi-stage constant-current charging using the charge map and command constant-voltage charging using the upper limit $V_n$ to the charging circuit 50. That is, the control unit 140 may change from the constant-current charging using the $n^{th}$ reference current $I_n$ to the constant-voltage charging using the upper limit $V_n$.

A first voltage profile 310 shown in FIG. 3 shows the correlation between the first to fourth reference SOCs $S_1$~$S_4$ and the first to fourth reference voltages $\Delta V_1$~$\Delta V_4$ for the battery B at BOL. The first voltage profile 310 may be recorded in the charge map in the format of a data table. The first voltage profile 310 includes first to fourth reference voltage curves. The $k^{th}$ reference voltage curve is part corresponding to the $k^{th}$ reference voltage range $\Delta V_k$ in the first voltage profile 310.

$S_k$ indicates the SOC of the battery B when the battery voltage of the battery B at BOL reaches the $k^{th}$ reference voltage $V_k$ by the constant-current charging using the $k^{th}$ reference current $I_k$.

Meanwhile, as the battery B gradually degrades, the capacity loss of the battery B increases, and thus the voltage rise by the same charge capacity increases compared to when the battery B is at BOL. Accordingly, the battery voltage having reached the $k^{th}$ reference voltage $V_k$ before the SOC reaches the $k^{th}$ reference SOC $S_k$ during the constant-current charging using the $k^{th}$ reference current $I_k$ of the charge map indicates that the battery B degraded compared to when the battery B is at BOL A second voltage profile 320 shown in FIG. 3 indicates the correlation between a change history of battery voltage and a change history of SOC, monitored through the constant-current charging process of the degraded battery B using the first to fourth reference currents $I_1$~$I_4$ in a sequential order for each of the first to fourth reference voltage ranges $\Delta V_1$~$\Delta V_4$ without applying the battery management method (see FIG. 4) according to the present disclosure. Referring to the second voltage profile 320, $Z_k$ is the battery SOC when the battery voltage of the degraded battery B reaches the $k^{th}$ reference voltage $V_k$, and is found lower than the $k^{th}$ reference SOC $S_k$. That is, $S_1 > Z_1$, $S_2 > Z_2$, $S_3 > Z_3$, $S_4 > Z_4$.

During the constant-current charging using the $k^{th}$ reference current $I_k$, the battery voltage having reached the $k^{th}$ reference voltage $V_k$ before the SOC of the battery B reaches the $k^{th}$ reference SOC $S_k$ indicates that it is necessary to reduce the $k^{th}$ reference current $I_k$ in the next multi-stage constant-current charging procedure. The decrease in the $k^{th}$ reference current $I_k$ may be determined considering the voltage history and/or SOC history monitored during charging by the $k^{th}$ reference current $I_k$.

A third voltage profile 330 shown in FIG. 3 indicates the correlation between the change history of battery voltage and the change history of SOC monitored through the process of charging the degraded battery B by applying a battery management method (see FIG. 4) according to the present disclosure, respectively. The third voltage profile 330 includes first to fourth measured voltage curves. The $k^{th}$ measured voltage curve is part corresponding to the $k^{th}$ reference voltage range $\Delta V_k$ in the third voltage profile 330.

Referring to the third voltage profile 330, the control unit 140 monitors the battery voltage, the battery current and the SOC at a preset time interval (for example, 0.001 sec) during the constant-current charging using the $k^{th}$ reference current $I_k$. The control unit 140 may change from the constant-current charging using the $k^{th}$ reference current $I_k$ to constant-voltage charging using the $k^{th}$ reference voltage $V_k$ in response to the battery voltage having reached the $k^{th}$ reference voltage $V_k$ before the SOC of the battery B reaches the $k^{th}$ reference SOC $S_k$. Accordingly, the battery B is charged at constant-voltage of the $k^{th}$ reference voltage $V_k$ from the time when the battery voltage reaches the $k^{th}$ reference voltage $V_k$ to the time when the SOC of the battery B reaches the $k^{th}$ reference SOC $S_k$. For example, after the constant-current charging using the second reference current $I_2$ is performed over the voltage range of $V_1$~$V_2$, the constant-voltage charging of the battery B is performed with the same charge voltage as the $k^{th}$ reference voltage $V_2$ until the SOC of the battery B reaches the second reference SOC $S_2$. During the constant-voltage charging using the $k^{th}$ reference voltage range $\Delta V_k$, the battery voltage gradually increases and the battery current gradually reduces. During the constant-voltage charging using the $k^{th}$ reference voltage range $\Delta V_k$, the control unit 140 may monitor the battery voltage, the battery current and the SOC at the predetermined time interval.

The control unit 140 may update the $k^{th}$ reference current $I_k$ of the charge map including the current profile 210 of FIG. 2 and the first voltage profile 310 of FIG. 3 based on the battery voltage, the battery current and the SOC monitored during charging over the $k^{th}$ reference voltage range $\Delta V_k$.

Each current $I_{11}$~$I_{14}$ of the current profile 230 of FIG. 2 may be the result of updating the reference currents $I_1$~$I_4$ of the charge map.

Specifically, the control unit 140 may determine at least one of an average voltage or an average SOC of the $k^{th}$ reference voltage curve. The average voltage of the $k^{th}$ reference voltage curve is an average battery voltage over the $k^{th}$ reference voltage range $\Delta V_k$ in the first voltage profile 310. The average SOC of the $k^{th}$ reference voltage curve is an average SOC over the $k^{th}$ reference voltage range $\Delta V_k$ in the first voltage profile 310.

The control unit 140 may determine at least one of an average voltage or an average SOC of the $k^{th}$ measured voltage curve. The average voltage of the $k^{th}$ measured voltage curve is an average battery voltage over the $k^{th}$ reference voltage range $\Delta V_k$ in the third voltage profile 330. The average SOC of the $k^{th}$ measured voltage curve is an average SOC over the $k^{th}$ reference voltage range $\Delta V_k$ in the third voltage profile 330.

Subsequently, the control unit 140 may update the $k^{th}$ reference current $I_k$ of the charge map based on at least one of the average voltage or the average SOC of the $k^{th}$ reference voltage curve and at least one of the average voltage or the average SOC of the $k^{th}$ measured voltage curve.

The control unit 140 may update the $k^{th}$ reference current $I_k$ based on a first ratio (less than 1) of the average SOC of the $k^{th}$ measured voltage curve to the average SOC of the $k^{th}$ reference voltage curve. For example, the control unit 140 may update the $k^{th}$ reference current $I_k$ to be equal to the multiplication of the first ratio and the $k^{th}$ reference current $I_k$.

Alternatively, the control unit 140 may update the $k^{th}$ reference current $I_k$ based on a second ratio (less than 1) of the average voltage of the $k^{th}$ reference voltage curve to the average voltage of the $k^{th}$ measured voltage curve. For example, the control unit 140 may update the $k^{th}$ reference current $I_k$ to equal to the multiplication of the second ratio and the $k^{th}$ reference current $I_k$.

Alternatively, the control unit 140 may update the $k^{th}$ reference current $I_k$ based on the first ratio and the second ratio. For example, the control unit 140 may update the $k^{th}$ reference current $I_k$ to be equal to the multiplication of the first ratio, the second ratio and the $k^{th}$ reference current $I_k$.

Alternatively, the control unit 140 may update the $k^{th}$ reference current $I_k$ based on a third ratio (less than 1) of a SOC of interest to the $k^{th}$ reference SOC $S_k$. For example, the control unit 140 may update the $k^{th}$ reference current $I_k$ to be equal to the multiplication of the third ratio and the $k^{th}$ reference current $I_k$. The SOC of interest may be equal to the SOC Uk of the battery B at the time when the battery voltage reaches the $k^{th}$ reference voltage $V_k$.

Meanwhile, the charging procedure according to the battery management method described above is often not performed in part of the reference voltage range $\Delta V_1$~$\Delta V_4$. For example, referring to FIGS. 2 and 3, in case that the charging procedure using the charge map starts when the battery voltage is higher than $V_0$, it is impossible to obtain the first measured voltage curve over the entire first reference voltage range $\Delta V_1$, and the above-described method cannot update the first reference current $I_1$. In another example, when the vehicle user separates a charging cable from the electric vehicle 1 before the battery voltage reaches $V_4$, it is impossible to obtain the fourth measured voltage curve over the entire fourth reference voltage range $\Delta V_4$, so it is impossible to update the fourth reference current $I_4$.

To solve the above-described problem, in case that charging starts when the battery voltage is larger than $V_0$, or charging ends when the battery voltage is smaller than $V_4$, the control unit 140 may update the reference current associated with each of the remaining reference voltage ranges based on the update information of at least one reference voltage range in which the measured voltage curve is obtained among all the reference voltage ranges $\Delta V_1$~$\Delta V_4$.

Assume that only the $k^{th}$ reference current $I_k$ corresponding to the $k^{th}$ reference voltage range $\Delta V_k$ was updated to $I_{1k}$ according to the above-described battery management method. The control unit 140 may determine a ratio of $I_{1k}$ to $I_k$, and update each of the remaining reference currents based on the determined ratio. For example, when the second reference current $I_2$ is updated from 120 A to 100 A, the control unit 140 may update the first reference current $I_1$, the third reference current $I_3$ and the fourth reference current $I_4$ by multiplying each of the first reference current $I_1$, the third reference current $I_3$ and the fourth reference current $I_4$ by $^{100}/_{120}=^5/_6$.

Assume that each of i and j is a natural number, i≤j, i is 2 or greater or j is less than n=4. Only the $i^{th}$ to $j^{th}$ reference currents $I_i$~$I_j$ corresponding to the $i^{th}$ to $j^{th}$ reference voltage ranges $\Delta V_i$~$\Delta V_j$ are updated to $I_{1i}$~$I_{1j}$ according to the battery management method (see FIG. 4), respectively, and the charging procedure may end. Then, the control unit 140 may update each of the remaining reference currents using the following equation.

$$I_{1x} = I_x \times \frac{1}{(j-i+1)} \times \sum_{y=i}^{j} \frac{I_{1y}}{I_y} = I_x \times \mu_{avg} \qquad \text{<Equation>}$$

In the above equation, x is a natural number of n or smaller except i to j, $I_x$ is the reference current before update, and $I_{1x}$ is the updated reference current. $\mu_{avg}$ is an average ratio of the $i^{th}$ to $j^{th}$ updated reference currents $I_{1i}$~$I_{1j}$ to the $i^{th}$ to $j^{th}$ reference currents $I_i$~$I_j$.

In an example, where i=2, j=3, n=4, $i_1$=150 A, $i_2$=120 A, $i_3$=110 A, $i_4$=90 A, $i_{12}$=100 A, $i_{13}$=95 A, $i_{11}$=$i_1$×1/(3−2+1)×{$i_{12}/i_2$+$i_{13}/i_3$} A=$i_1$×½×{$^{100}/_{120}$+$^{95}/_{110}$} A≈127 A, $i_{14}$=$i_4$×1/(3−2+1)×{$i_{12}/i_2$+$i_{13}/i_3$} A=$i_4$×½×{$^{100}/_{120}$+$^{95}/_{110}$} A≈76 A.

FIG. 4 is a flowchart exemplarily showing a battery management method according to a first embodiment of the present disclosure. The method of FIG. 4 may start in response to the charge start command from the vehicle user.

Referring to FIGS. 1 to 4, in step S410, the control unit 140 selects the $k^{th}$ reference current $I_k$ corresponding to the $k^{th}$ reference voltage range $\Delta V_k$ to which the battery voltage of the battery B belongs, from the charge map. For example, when the battery voltage is equal to or higher than $V_1$ and less than $V_2$, the second reference current $I_2$ is selected.

In step S420, the control unit 140 commands constant-current charging using the $k^{th}$ reference current $I_k$ to the charging circuit 50. Accordingly, the charging circuit 50 starts the constant-current charging using the $k^{th}$ reference current $I_k$ by supplying the $k^{th}$ reference current $I_k$ as the charge current to the battery B.

In step S430, the control unit 140 determines whether the battery voltage reached the $k^{th}$ reference voltage $V_k$ before the battery SOC reaches the $k^{th}$ reference SOC $S_k$. When a value of the step S430 is "YES", step S450 is performed. When the value of the step S430 is "NO", the step S430 is performed again after the lapse of a predetermined time.

In step S440, the control unit 140 commands constant-voltage charging using the $k^{th}$ reference voltage $V_k$ to the charging circuit 50. Accordingly, the charging circuit 50 terminates the constant-current charging using the $k^{th}$ reference current $I_k$, and at the same time, supplies the charge voltage that is equal to the $k^{th}$ reference voltage $V_k$ to the battery B.

In the step S450, the control unit 140 determines whether the battery SOC reached the $k^{th}$ reference SOC $S_k$. When a value of the step S450 is "YES", step S460 is performed. When the value of the step S450 is "NO", the step S450 is performed again after the lapse of a predetermined time.

In the step S460, the control unit 140 determines the $k^{th}$ measured voltage curve. The $k^{th}$ measured voltage curve indicates the correlation between the battery voltage and the battery SOC over the charging period of the constant-current charging using the $k^{th}$ reference current $I_k$.

In step S470, the control unit 140 determines whether the voltage range of the $k^{th}$ measured voltage curve is equal to the $k^{th}$ reference voltage range $\Delta V_k$. When a value of the step S470 is "YES", step S480 is performed. When the value of the step S470 is "NO", step S490 may be performed. For example, when constant-current charging with the first reference current $I_1$ is performed from the time when the battery voltage is higher than $V_0$ and lower than $V_1$, the value of the step S470 is "NO".

In the step S480, the control unit 140 updates the charge map based on the $k^{th}$ reference voltage curve and the $k^{th}$ measured voltage curve.

In the step S490, the control unit 140 determines whether the charge index k is equal to n. That is, the control unit 140 determines whether charging for the last reference voltage range $\Delta V_n$ defined by the charge map was completed. When a value of the step S490 is "NO", the charge index k may be increased by 1 in the step S492, and the method may return to the step S430. When the value of the step S490 is "YES", the method of FIG. 4 may end.

The method of FIG. 4 may start in response to the charge start command when a predetermined update condition is satisfied. The update condition is for preventing the unnecessarily frequent updates of the charge map. The update condition indicates an increase in the degree of degradation of the battery B over a predetermined level, and may be, for example, an increase in the accumulated capacity of the battery B by at least a first threshold (for example, 100 Ah[ampere-hour]) than the accumulated capacity at the previous update time, an increase in the cycle number of the battery B by at least a second threshold (for example, 50 times) than the cycle number at the previous update time, a reduction in the capacity retention rate of the battery B by at least a third threshold (for example, 5%) than the capacity retention rate at the previous update time, and a lapse of at least a threshold time (for example, a month) from the previous update time.

Figure 5:
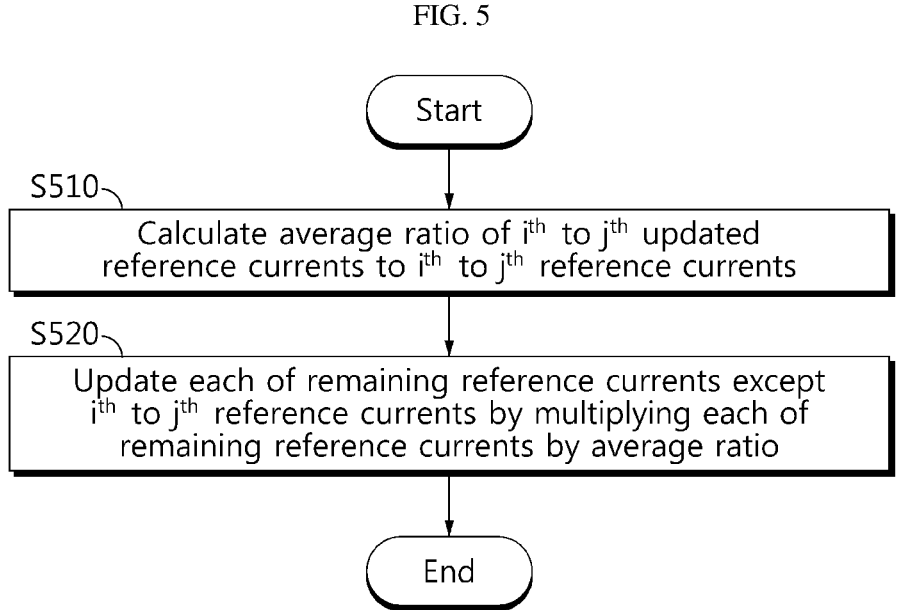
FIG. 5 is a flowchart exemplarily showing a battery management method according to a second embodiment of the present disclosure.

FIG. 5 is a flowchart exemplarily showing a battery management method according to a second embodiment of the present disclosure. When only the $i^{th}$ to $j^{th}$ reference currents $I_i\sim I_j$ among the first to $n^{th}$ reference currents $I_1\sim I_n$ are updated through the method of FIG. 4, the method of FIG. 5 may be used to update each of the remaining reference currents. That is, the method of FIG. 5 may be performed when the battery B is charged over only part of the voltage range of $V_0\sim V_n$ by the method of FIG. 4. As described above, each of i and j is a natural number, i<j, and i is 2 or greater, or j is less than n (for example, 4).

In step S510, the control unit 140 calculates the average ratio of the $i^{th}$ to $j^{th}$ updated reference currents $I_{1i}\sim I_{1j}$ to the $i^{th}$ to $j^{th}$ reference currents $I_i\sim I_j$ (see $\mu_{avg}$ of the above equation).

In step S520, the control unit 140 updates each of the remaining reference currents except the $i^{th}$ to $j^{th}$ reference currents $I_i\sim I_j$ among the first to $n^{th}$ reference currents $I_1\sim I_n$ by multiplying each of the remaining reference currents by the average ratio.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system, comprising:
    a voltage sensor configured to generate a voltage signal indicating a battery voltage of a battery;
    a current sensor configured to generate a current signal indicating a battery current of the battery;
    memory configured to store a charge map recording a correlation between first to $n^{th}$ reference currents, first to $n^{th}$ reference voltage ranges, first to $n^{th}$ reference states of charge (SOCs) and first to $n^{th}$ reference voltage curves for multi-stage constant-current charging of the battery; and
    a controller;
    the memory having instructions programmed thereon that, when executed, are configured to cause the controller to:
    determine a SOC of the battery based on at least one of the voltage signal or the current signal;
    in response to a charge start command, command constant-current charging to a charging circuit connected to the battery using a $k^{th}$ reference current corresponding to a $k^{th}$ reference voltage range to which the battery voltage belongs, and
    in response to the battery voltage having reached an upper limit of the $k^{th}$ reference voltage range, update the charge map by comparing a $k^{th}$ measured voltage curve indicating a correlation between the battery voltage and the SOC of the battery over a charging period of the constant-current charging with a $k^{th}$ reference voltage curve of the charge map,
    wherein n is a natural number equal to 2 or greater, and k is a natural number of n or smaller.

2. The battery management system according to claim 1, wherein the instructions are configured to cause the controller to update the $k^{th}$ reference current based on a ratio of an average SOC of the $k^{th}$ measured voltage curve to an average SOC of the $k^{th}$ reference voltage curve.

3. The battery management system according to claim 1, wherein the instructions are configured to cause the controller to update the $k^{th}$ reference current based on a ratio of an average voltage of the $k^{th}$ reference voltage curve to an average voltage of the $k^{th}$ measured voltage curve.

4. The battery management system according to claim 1, wherein the instructions are configured to cause the controller to update the $k^{th}$ reference current based on a first ratio of an average SOC of the $k^{th}$ measured voltage curve to an average SOC of the $k^{th}$ reference voltage curve and a second ratio of an average voltage of the $k^{th}$ reference voltage curve to an average voltage of the $k^{th}$ measured voltage curve.

5. The battery management system according to claim 1, wherein the instructions are configured to cause the controller to update the $k^{th}$ reference current based on a ratio of a SOC of interest to a $k^{th}$ reference SOC, wherein the SOC of interest is the SOC of the battery at a point in time when the battery voltage reaches the upper limit of the $k^{th}$ reference voltage range.

6. The battery management system according to claim 1, wherein the instructions are configured to cause the controller to update each remaining reference current except the $k^{th}$ reference current based on a ratio of the updated $k^{th}$ reference current to the $k^{th}$ reference current.

7. The battery management system according to claim 1, wherein the instructions are configured to cause the controller to command constant-voltage charging to the charging circuit using the upper limit of the $k^{th}$ reference voltage range in response to the battery voltage having reached the upper limit of the $k^{th}$ reference voltage range.

8. A battery pack comprising the battery management system according to claim 1.

9. An electric vehicle comprising the battery pack according to claim 8.

10. A battery management method, comprising:

in response to a charge start command, commanding, by the controller, constant-current charging using a $k^{th}$ reference current corresponding to a $k^{th}$ reference voltage range to which a battery voltage of a battery belongs to a charging circuit connected to the battery, using a charge map recording a correlation between first to $n^{th}$ reference currents, first to $n^{th}$ reference voltage ranges, first to $n^{th}$ reference states of charge (SOCs) and first to $n^{th}$ reference voltage curves for multi-stage constant-current charging of the battery; and in response to the battery voltage having reached an upper limit of the $k^{th}$ reference voltage range, updating, by the controller, the charge map by comparing a $k^{th}$ measured voltage curve indicating a correlation between the battery voltage and a SOC of the battery over a charging period of the constant-current charging with a $k^{th}$ reference voltage curve of the charge map, wherein n is a natural number equal to 2 or greater, and k is a natural number of n or smaller.

11. The battery management method according to claim 10, wherein updating the charge map comprises updating the $k^{th}$ reference current based on a ratio of an average SOC of the $k^{th}$ measured voltage curve to an average SOC of the $k^{th}$ reference voltage curve.

\* \* \* \* \*